(12) United States Patent
Saito et al.

(10) Patent No.: US 11,252,506 B2
(45) Date of Patent: Feb. 15, 2022

(54) HOWLING SUPPRESSION APPARATUS, AND METHOD AND PROGRAM FOR THE SAME

(71) Applicant: NIPPON TELEGRAPH AND TELEPHONE CORPORATION, Chiyoda-ku (JP)

(72) Inventors: Shoichiro Saito, Musashino (JP); Kazunori Kobayashi, Musashino (JP); Akira Nakagawa, Musashino (JP); Noboru Harada, Musashino (JP)

(73) Assignee: NIPPON TELEGRAPH AND TELEPHONE CORPORATION, Chiyoda-ku (JP)

( * ) Notice: Subject to any disclaimer, the term of this patent is extended or adjusted under 35 U.S.C. 154(b) by 0 days.

(21) Appl. No.: 16/969,273

(22) PCT Filed: Feb. 14, 2019

(86) PCT No.: PCT/JP2019/005241
§ 371 (c)(1),
(2) Date: Aug. 12, 2020

(87) PCT Pub. No.: WO2019/160006
PCT Pub. Date: Aug. 22, 2019

(65) Prior Publication Data
US 2021/0006899 A1 Jan. 7, 2021

(30) Foreign Application Priority Data
Feb. 16, 2018 (JP) .............................. JP2018-026181

(51) Int. Cl.
*H04R 3/02* (2006.01)
*G10L 21/034* (2013.01)
(Continued)

(52) U.S. Cl.
CPC .............. *H04R 3/02* (2013.01); *G10L 21/034* (2013.01); *H03G 3/32* (2013.01); *H04M 9/082* (2013.01);
(Continued)

(58) Field of Classification Search
CPC .......... H04R 3/02; H04R 1/406; H04R 3/005; G10L 21/034; H03G 3/32; H03G 2201/103; H04M 9/082
See application file for complete search history.

(56) References Cited

U.S. PATENT DOCUMENTS

2003/0012388 A1  1/2003 Ura
2012/0114141 A1  5/2012 Tanaka
(Continued)

FOREIGN PATENT DOCUMENTS

| CN | 102474682 A | 5/2012 |
| JP | 6-164278 A | 6/1994 |
| JP | 2011-24071 A | 2/2011 |

OTHER PUBLICATIONS

International Search Report dated Mar. 26, 2019 in PCT/JP2019/005241 filed Feb. 14, 2019, 1 page.

*Primary Examiner* — Andrew L Sniezek
(74) *Attorney, Agent, or Firm* — Oblon, McClelland, Maier & Neustadt, L.L.P.

(57) ABSTRACT

A howling suppression apparatus includes: an integration processing part that obtains the maximum value among L values corresponding to n-th frames of L i-th signals, for i=1, 2, . . . , L, L being any integer equal to or greater than 2, the L i-th signals being frequency-domain signals obtained from sound signals collected by multiple microphones; and a howling suppression processing part that performs howling suppression processing on at least any of the L i-th signals using the maximum value.

9 Claims, 13 Drawing Sheets

(51) Int. Cl.
*H03G 3/32* (2006.01)
*H04M 9/08* (2006.01)
*H04R 1/40* (2006.01)
*H04R 3/00* (2006.01)

(52) U.S. Cl.
CPC ............ *H04R 1/406* (2013.01); *H04R 3/005* (2013.01); *H03G 2201/103* (2013.01)

(56) References Cited

U.S. PATENT DOCUMENTS

2012/0281854 A1* 11/2012 Ishibashi ................ H04R 1/403
381/92
2016/0029124 A1 1/2016 Paranjpe

* cited by examiner

HOWLING SUPPRESSION APPARATUS, AND METHOD AND PROGRAM FOR THE SAME

TECHNICAL FIELD

The present invention relates to a technique for suppressing howling that occurs in amplifying voices with a speaker to facilitate conversation.

BACKGROUND ART

In a wide space, a situation may arise in which people have difficulty in conversation because their voices are not sufficiently heard by target persons. In such cases, loudspeakers are often used. When loudspeakers are used in a scene such as a conference with many participants, as shown in FIG. 1, the voice of a speaking person away from listeners in the same space may be collected by a microphone speaker 1 disposed near the speaking person, and may be amplified and reproduced by a microphone speaker 2 disposed near the listeners. The loudspeakers include two microphones and two speakers (for example, two microphone speakers, each incorporating a microphone and a speaker into one housing). Sound collected by one of the two microphones closer to the speaking person is reproduced by one of the two speakers farther from the speaking person.

In a system as in FIG. 1, speaking persons are not so far from each other unlike in such a case that the voice of a person speaking in an auditorium is amplified. This creates a situation in which a speaking person's voice itself (a direct sound) is slightly heard in addition to the amplified voice. If the amplified voice is reproduced with a delay, the amplified voice sounds unsynchronized with the direct sound of the speaking person's voice, and this gives a feeling of auditory unnaturalness. For example, if an amplified voice is heard 20 to 30 ms after a direct sound, the human ear recognizes these sounds as an echo and feels them unnatural. Therefore, low-delay processing is required in a system as in FIG. 1.

In a microphone speaker system as above, generally, howling occurs that depends on the volume of amplified sounds and the room environment. Methods for preventing howling include increasing the distance between a microphone and a speaker and reducing the speaker volume, as well as providing a howling prevention function. For example, patent literature 1 describes a method of detecting howling by performing thresholding on the power for each frequency.

PRIOR ART LITERATURE

Patent Literature

Patent literature 1: Japanese Patent Application Laid-Open No. H6-164278

SUMMARY OF THE INVENTION

Problems to be Solved by the Invention

The system as in FIG. 1 may experience howling as shown in FIG. 2, in which two close frequencies produce howling, and the temporal waveforms of the howling create beats. In FIG. 2, the howling has not developed so much to diverge. However, particularly around 0.4 seconds, large howling components only remain despite the absence of voices, resulting in very uncomfortable sounds similar to typical howling sounds. Unfortunately, problems will arise if this case is addressed with conventional techniques. Specifically, addressing this case with conventional techniques requires "analyzing the frequencies in a sufficiently long frame for excluding the influence of the beating phenomenon" or "smoothing in the temporal direction for reducing the influence of the beat components on the result of analysis in short time frames" in order to detect the occurrence of howling. Both require observation for a long period, which is against the above-described requirement "low delay" or which allows howling to be addressed only after some howling occurs because detection is delayed.

An object of the present invention is to provide a howling suppression apparatus, and a method and a program for the same, that enable preventing a delay in howling detection and improving a howling prevention effect of a loudspeaker system.

Means to Solve the Problems

For solving the above problems, according to an aspect of the present invention, a howling suppression apparatus comprises: an integration processing part that obtains a maximum value among L values corresponding to n-th frames of L i-th signals, for i=1, 2, . . . , L, L being any integer equal to or greater than 2, the L i-th signals being frequency-domain signals obtained from sound signals collected by a plurality of microphones; and a howling suppression processing part that performs howling suppression processing on at least any of the L i-th signals using the maximum value.

For solving the above problems, according to another aspect of the present invention, a howling suppression apparatus comprises: an integration processing part that obtains a minimum value among L values corresponding to n-th frames of L i-th signals, for i=1, 2, . . . , L, L being any integer equal to or greater than 2, the L i-th signals being frequency-domain signals obtained from sound signals collected by a plurality of microphones; a howling determination part that determines that howling is likely to occur or is occurring if a sign of a difference between two values corresponding to n-th frames of two of the i-th signals changes a predetermined number of times or more in a predetermined period, the two of the i-th signals being sound signals collected by two of L microphones and converted into frequency-domain signals; and a howling suppression processing part that performs howling suppression processing on at least any of the L i-th signals using the minimum value if it is determined that howling is likely to occur or is occurring.

For solving the above problems, according to a further aspect of the present invention, a method for suppressing howling comprises: an integration processing step of obtaining a maximum value among L values corresponding to n-th frames of L i-th signals, for i=1, 2, . . . , L, L being any integer equal to or greater than 2, the L i-th signals being frequency-domain signals obtained from sound signals collected by a plurality of microphones; and a howling suppression processing step of performing howling suppression processing on at least any of the L i-th signals using the maximum value.

For solving the above problems, according to a still further aspect of the present invention, a method for suppressing howling comprises: an integration processing step of obtaining a minimum value among L values corresponding to n-th frames of L i-th signals, for i=1, 2, . . . , L, L being any integer equal to or greater than 2, the L i-th signals being frequency-domain signals obtained from sound signals collected by a plurality of microphones; a howling determination step of determining that howling is likely to occur or is occurring if a sign of a difference between two values corresponding to n-th frames of two of the i-th signals changes a predetermined number of times or more in a predetermined period, the two of the i-th signals being sound signals collected by two of L microphones and converted into frequency-domain signals; and a howling suppression processing step of performing howling suppression processing on at least any of the L i-th signals using the minimum value if it is determined that howling is likely to occur or is occurring.

Effects of the Invention

According to the present invention, a delay in howling detection can be prevented to improve a howling prevention effect of a loudspeaker system.

DETAILED DESCRIPTION OF THE EMBODIMENTS

Figure 1:
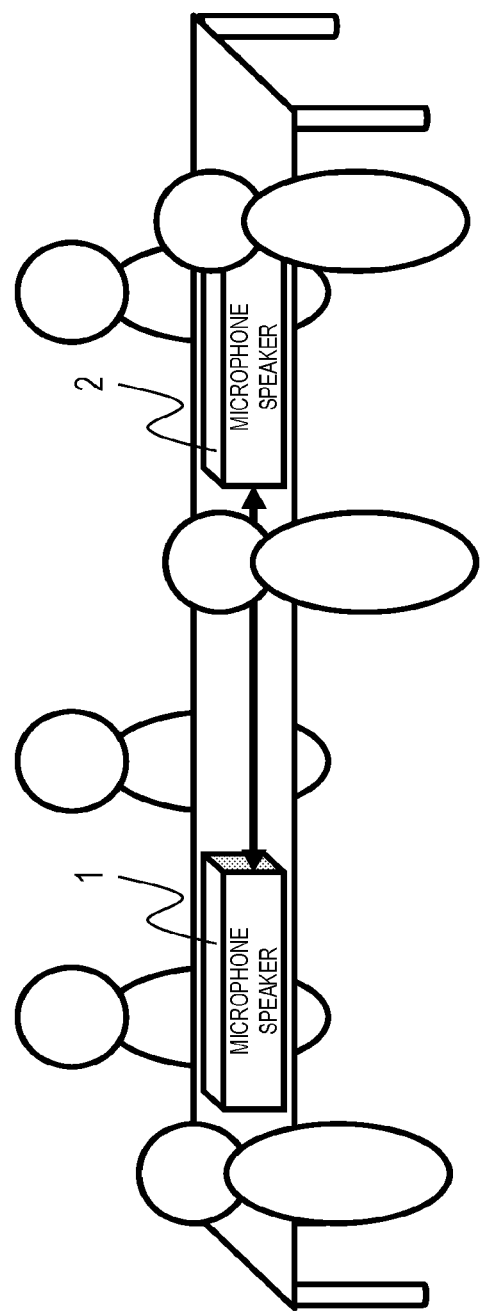
FIG. 1 is a diagram for describing a situation in which loudspeakers are used.

Embodiments of the present invention will be described below.

In the drawings referred to in the following description, components having like functions and steps representing like processing are labeled with like symbols, and redundant description of such components and steps will not be given. In the following description, symbols such as "-" used in the text are originally to be shown above the characters that follow the symbols but are shown immediately before the characters because of limitations in text notation. In formulae, these symbols are shown at the original positions. Processing performed on an element basis for a vector or matrix are intended to apply to all the elements of the vector or matrix unless otherwise specified.

<Key Points of First Embodiment>

Signal analysis values of two howling suppression channels are associated with each other to obtain more accurate information about components that may constitute howling frequencies. This prevents howling from diverging due to delayed detection.

First Embodiment

Figure 3:
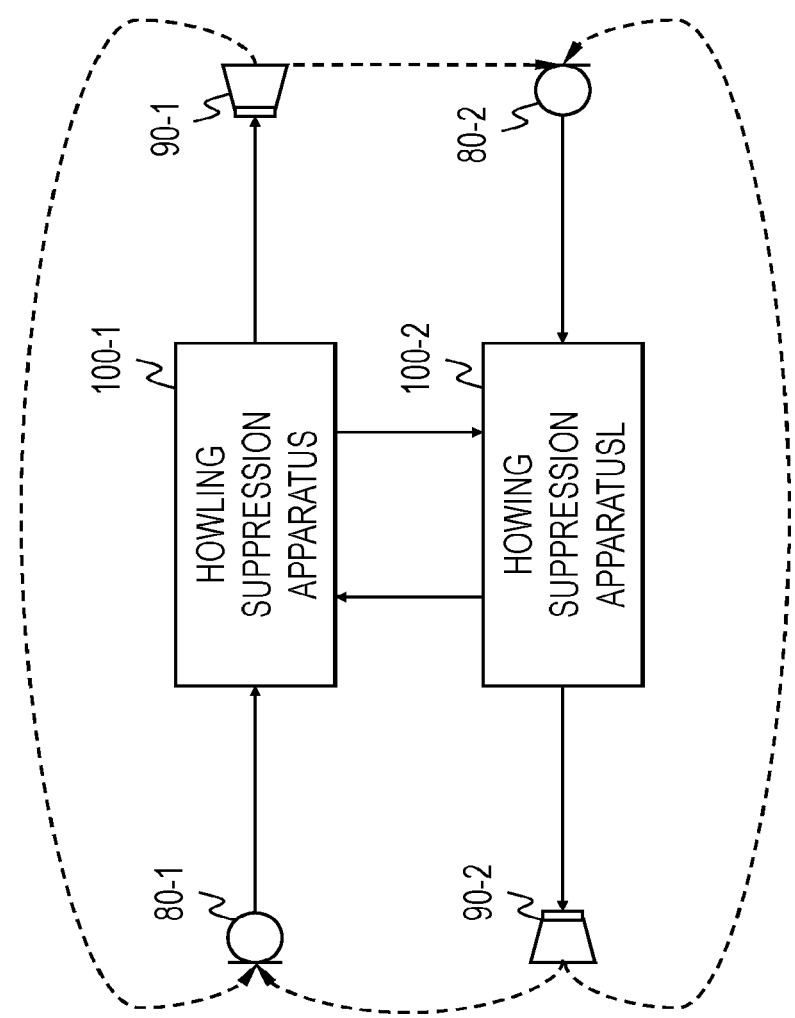
FIG. 3 is a diagram showing an exemplary arrangement of two howling suppression apparatuses.

A howling suppression system includes two howling suppression apparatuses 100-$i$, for i=1, 2. FIG. 3 shows an exemplary arrangement of the two howling suppression apparatuses 100-$i$.

Figure 4:
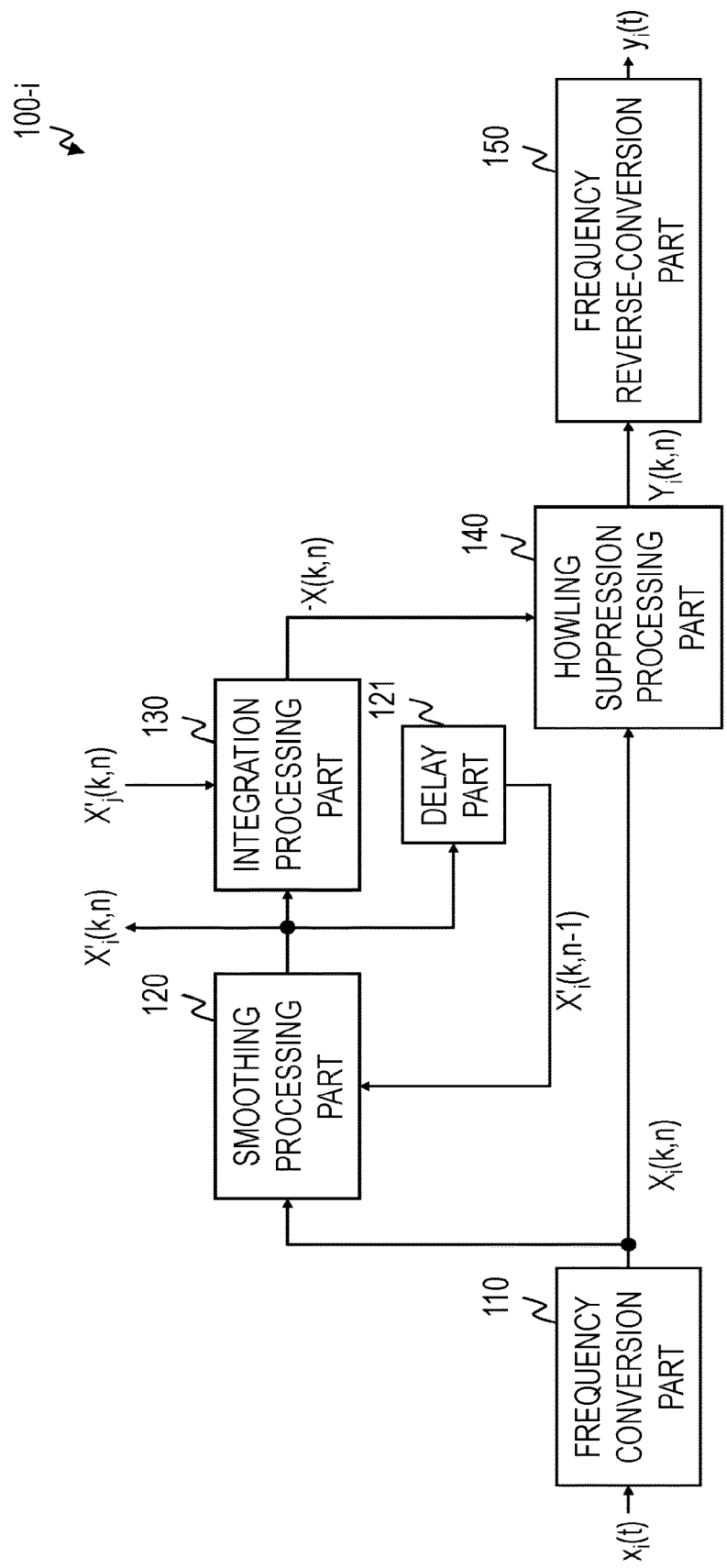
FIG. 4 is a functional block diagram of a howling suppression apparatus according to a first embodiment.
Figure 5:
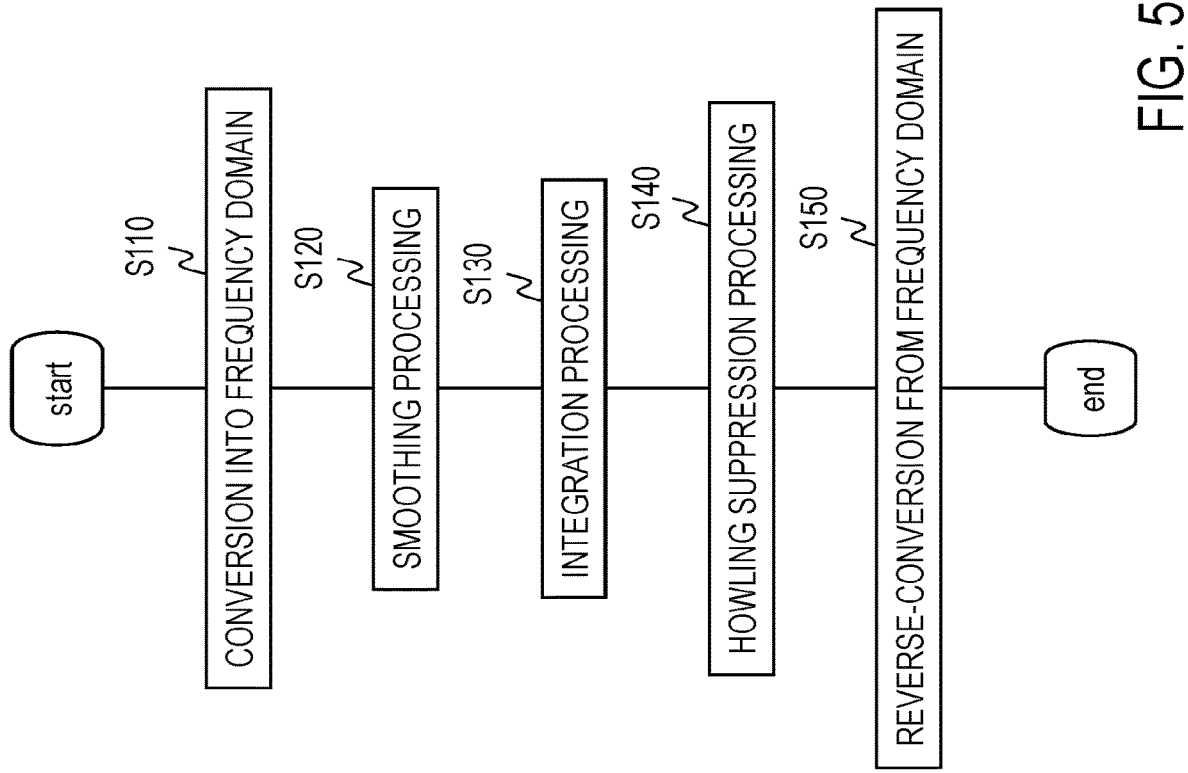
FIG. 5 is a diagram showing an exemplary process flow of the howling suppression apparatus according to the first embodiment.

FIG. 4 shows a functional block diagram of each howling suppression apparatus according to a first embodiment, and FIG. 5 shows a process flow thereof.

The howling suppression apparatus 100-$i$ includes a frequency conversion part 110, a smoothing processing part 120, a delay part 121, an integration processing part 130, a howling suppression processing part 140, and a frequency reverse-conversion part 150.

Figure 6:
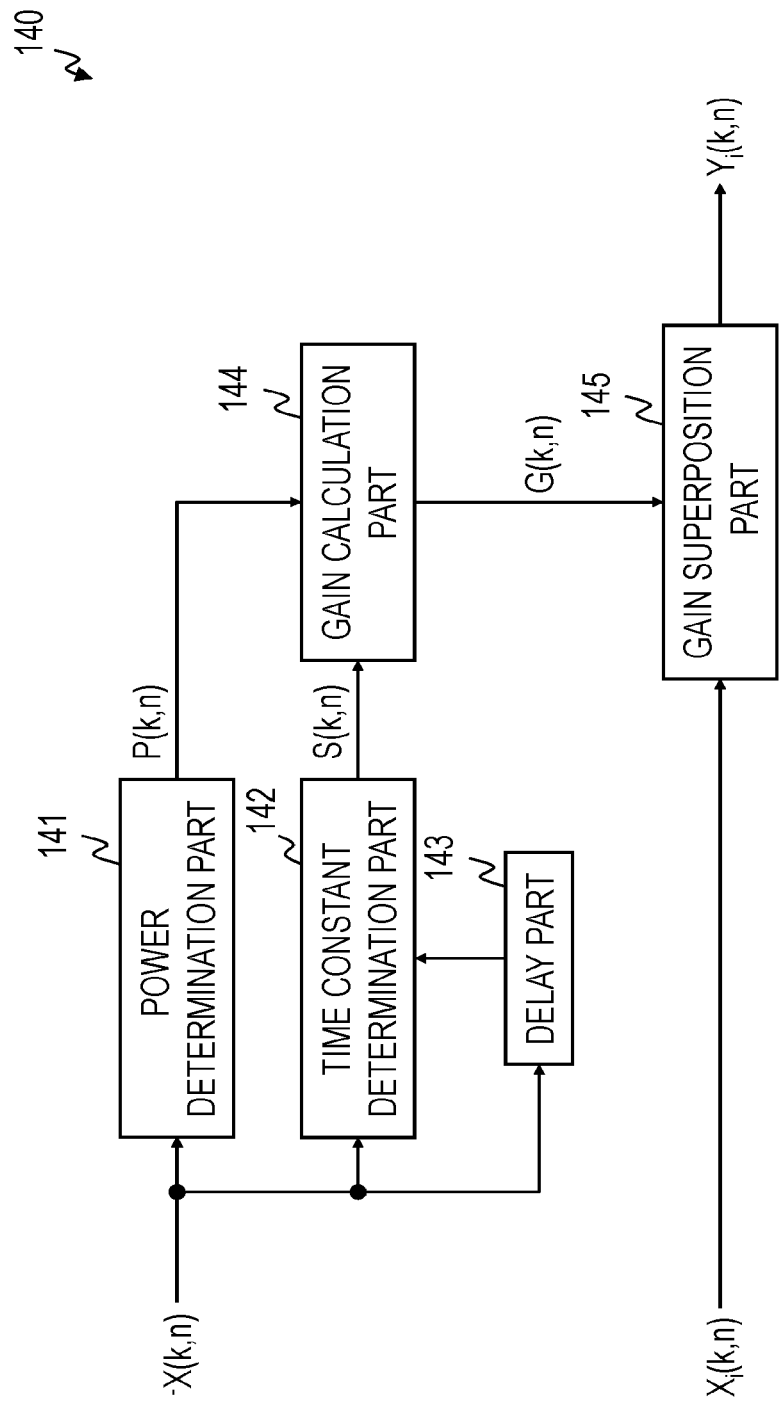
FIG. 6 is a functional block diagram of a howling suppression processing part.
Figure 7:
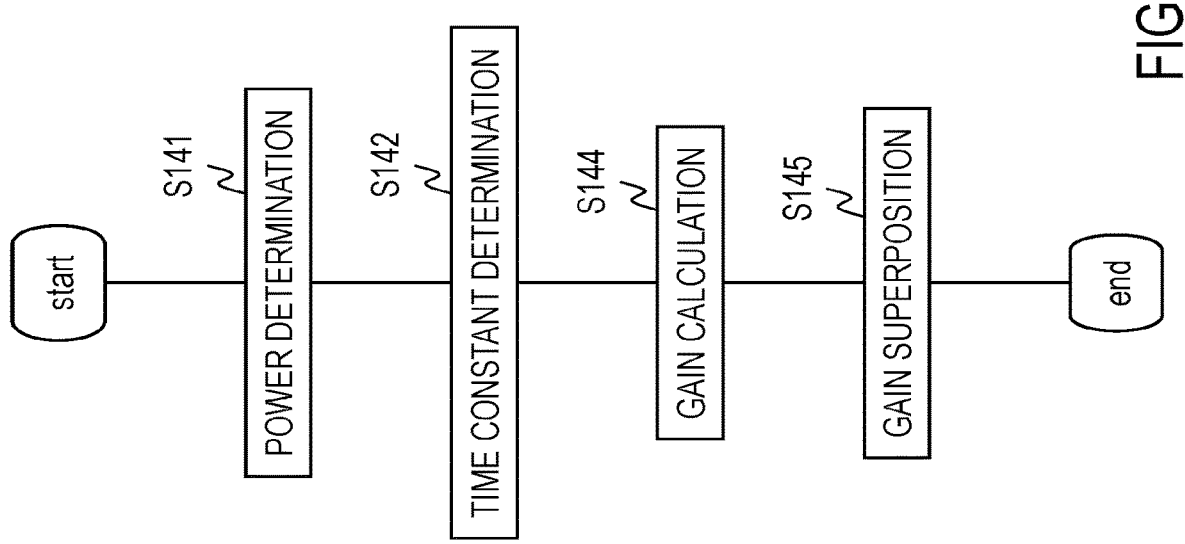
FIG. 7 is a diagram showing an exemplary process flow of the howling suppression processing part.

The howling suppression processing part 140 includes a power determination part 141, a time constant determination part 142, a delay part 143, a gain calculation part 144, and a gain superposition part 145. FIG. 6 shows a functional block diagram of the howling suppression processing part 140, and FIG. 7 shows a process flow thereof.

As shown in FIG. 3, each howling suppression apparatus 100-$i$ receives, as inputs, a sound signal collected by a microphone 80-$i$ of its own channel and an output value of the smoothing processing part 120 of the howling suppression apparatus 100-$j$ of the other channel, for j=1, 2, and i≠j. The howling suppression apparatus 100-$i$ suppresses howling components in the sound signal collected by the microphone 80-$i$ of its own channel and outputs the suppressed signal to a speaker 90-$i$ of its own channel. The speaker 90-$i$ reproduces the suppressed signal. For example, the microphone 80-$i$ and a speaker 90$j$ constitutes one microphone speaker.

Each howling suppression apparatus is, for example, a special apparatus configured in such a manner that a special program is read into a known or special-purpose computer having a central processing unit (CPU) and main memory (RAM: Random Access Memory). The howling suppression apparatus performs, for example, processing under the control of the central processing unit. Data input to the howling suppression apparatus and data resulting from the processing are, for example, stored in the main memory and the data stored in the main memory are read as needed into the central processing unit to be used for other processing. Each processing part of the howling suppression apparatus may be implemented at least in part in hardware such as an integrated circuit. Each storage part in the howling suppression apparatus may be implemented, for example, in the main memory such as RAM (Random Access Memory) or in middleware such as a relational database or a key-value store. Note that each storage part may not necessarily be provided internally to the howling suppression apparatus. Rather, each storage part may be provided externally to the howling suppression apparatus as an auxiliary storage device implemented as a hard disk, an optical disc, or semiconductor memory elements such as flash memory.

Each part will be described below.

<Frequency Conversion Part 110>

The frequency conversion part 110 receives, as an input, a sound signal $x_i(t)$ collected by the microphone 80-$i$ of its own channel, converts the signal into a frequency-domain signal (S110), and outputs the converted signal $X_i(k,n)$. For example, the time-domain sound signal $x_i(t)$ is converted into the frequency-domain signal with Fourier transform (such as fast Fourier transform) as expressed by the following formula:

$$X_i(k,n)=FT(x_i(n))$$

where $x_i(n)=[x_i(nT-T+1), x_i(nT-T+2), \ldots x_i(nT)]$, n denotes the frame number at the current time, FT denotes Fourier transform, T denotes the frame size of Fourier transform (T is any integer equal to or greater than 2), and k denotes the frequency index. t denotes the discrete-time index, and Fourier transform is performed for each frame period T/D (D is any integer equal to or greater than 2 and by which T is divisible) using the past T sound signals $x_i(t)$, $x_i(t-1), \ldots, x_i(t-T+1)$ at time t and the preceding times. Here, the relationship t=nT/D is satisfied.

The signals input to the howling suppression apparatuses 100-$i$ and the frequency conversion parts 110 may not be the sound signals themselves collected by the microphones, but may be signals resulting from processing sound signals. For example, sound signals collected by m microphones (e.g., a microphone array) may be subjected to beamforming processing to obtain L (in this embodiment, L=2) output signals each having a predetermined directionality. These output signals may be input to the howling suppression apparatuses 100-$i$ and the frequency conversion parts 110 in place of the sound signal $x_i(t)$. The signals to be input may be subjected to other types of signal processing, such as noise suppression processing, instead of beamforming processing. In essence, L signals obtained from sound signals collected by microphones may be input to the howling suppression apparatuses 100-$i$ and the frequency conversion parts 110.

<Smoothing Processing Part 120>

The smoothing processing part 120 receives the signal $X_i(k,n)$ as an input, retrieves a value $X_i'(k,n-1)$ for the immediately preceding time (frame) from the delay part 121, smoothes the signal $X_i(k,n)$ in the temporal direction (S120) to obtain a value $X_i'(k,n)$, and outputs the value to the integration processing part 130 and the howling suppression apparatus 100-$j$. The smoothing processing part 120 further stores the value $X_i'(k,n)$ in the delay part 121 for use in smoothing processing for the next frame n+1. For example, each frequency component is smoothed in the temporal direction by calculating a weighted sum of the frequency component and the value $X_i'(k,n-1)$ for the immediately preceding time (frame) with the following formula: $X_i'(k,n)=\|X_i(k,n)\|+\alpha X_i'(k,n-1)$ where $\alpha$ is a time constant that is a real number greater than or equal to 0 and less than 1. The greater the value of $\alpha$ is, the greater amount of past information reflects.

<Integration Processing Part 130>

The integration processing part 130 receives, as inputs, the value $X_i'(k,n)$, which is the output value of the smoothing processing part 120 of the howling suppression apparatus 100-$i$, and a value $X_j'(k,n)$, which is the output value of the smoothing processing part 120 of the other howling suppression apparatus 100-$j$. The integration processing part 130 obtains the maximum value $^-X(k,n)$ between the two values $X_i'(k,n)$ and $X_j'(k,n)$ (S130) and outputs the maximum value. This processing of obtaining the maximum value may also be referred to as the processing of integrating the two values $X_i'(k,n)$ and $X_j'(k,n)$, and the maximum value $^-X(k,n)$ may also be referred to as the integrated value. For example, the maximum value is obtained with the following formula:

$$^-X(k,n)=\max\{X_i'(k,n),X_j'(k,n)\}$$

where max { } means outputting the maximum value in { }.

Figure 2:
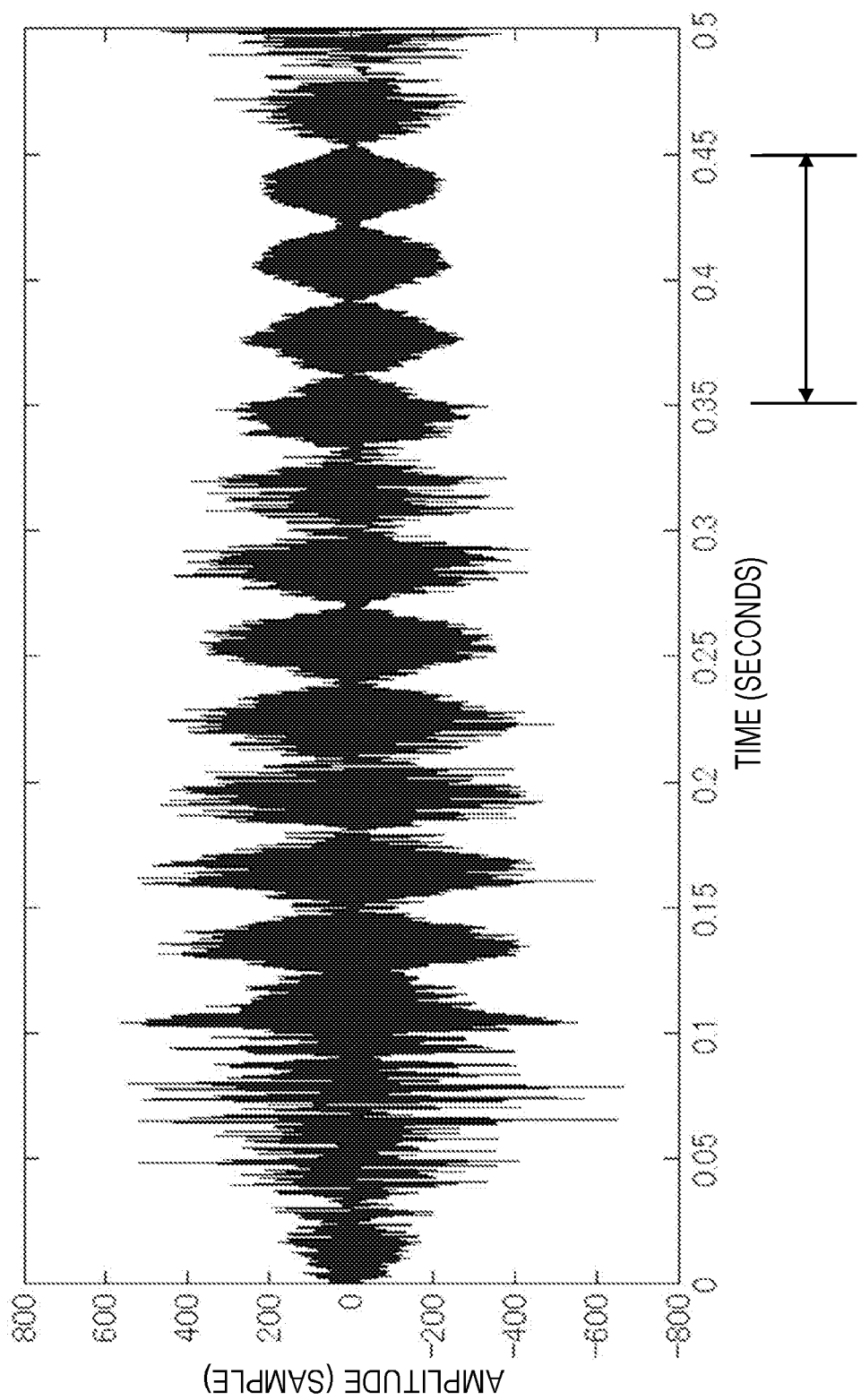
FIG. 2 is a diagram for describing a howling state.
Figure 8:
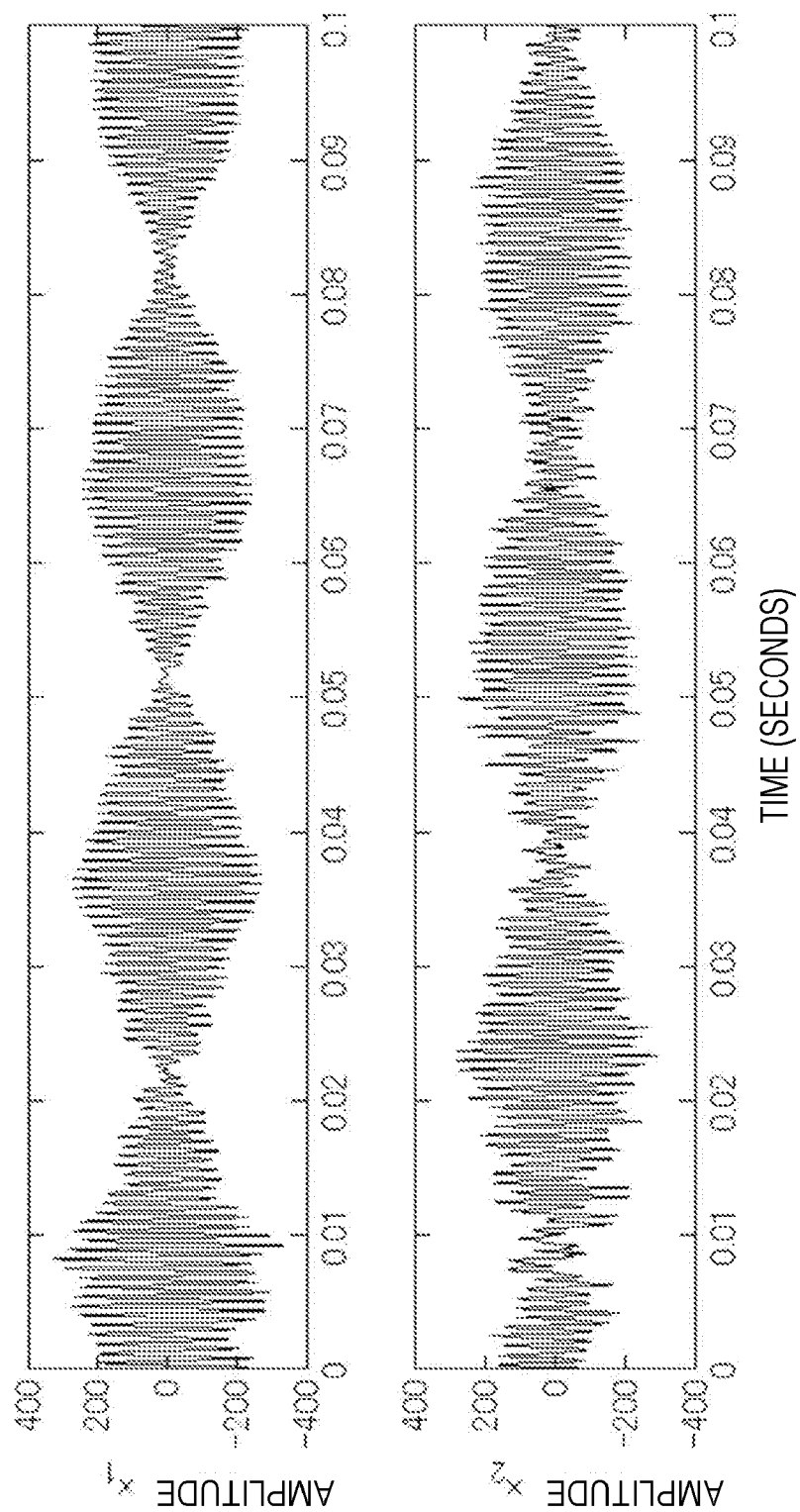
FIG. 8 is a diagram of an enlarged 0.1-second interval from 0.35 to 0.45 seconds in FIG. 2, in which vertically arranged $x_1$ and $x_2$ are plotted.

With this configuration, the system utilizes the fact that, if howling occurs in the loop of two microphone speakers, beats are out of phase between the respective microphone input signals. For example, if the maximum phase shift is $\pi$, the howling becomes locally maximum at one microphone input when the howling becomes locally minimum at the other microphone input, and vice versa. FIG. 8 shows an enlarged 0.1-second interval from 0.35 to 0.45 seconds in FIG. 2, in which vertically arranged $x_1$ and $x_2$ are plotted. It can be seen from FIG. 8 that the beat peaks do not align in time. Therefore, if the beats are out of phase and their amplitudes are close, the maximum value between the two values can be taken to reduce the influence of the beat amplitudes.

<Howling Suppression Processing Part 140>

The howling suppression processing part 140 receives the maximum value $^-X(k,n)$ and the frequency-domain signal $X_i(k,n)$ as inputs, performs howling suppression processing on the signal $X_i(k,n)$ using the maximum value $^-X(k,n)$ (S140), and outputs a suppressed signal $Y_i(k,n)$. Using the maximum value $^-X(k,n)$ corresponds to utilizing the fact that howling components are out of phase among sound signals collected by L (in this embodiment, L=2) microphones. That is, it can be said that the howling suppression processing part 140 performs the howling suppression processing by utilizing the fact that howling components are out of phase among sound signals collected by L microphones.

In this embodiment, at least either (i) if the maximum value $^-X(k,n)$ is greater than a value indicating predetermined power or (ii) if a value indicating a variation in the maximum value $^-X(k,n)$ is greater than a value indicating a predetermined variation, the howling suppression processing part 140 performs the howling suppression processing by multiplying the signal $X_i(k,n)$ by the smaller one of a first gain obtained based on the maximum value $^-X(k,n)$ and a second gain obtained based on the value indicating the variation in the maximum value $^-X(k,n)$. Details of processing in each part of the howling suppression processing part 140 will be described below with reference to FIGS. 6 and 7.

<Power Determination Part 141>

The power determination part 141 receives the maximum value $^-X(k,n)$ as an input and determines whether the maximum value $^-X(k,n)$ satisfies a power condition. For example, the power determination part 141 determines whether the maximum value $^-X(k,n)$ is greater than a value indicating predetermined power (a threshold Thr1, which is a positive real number precalculated on the basis of, e.g., experiments) (S141) and outputs a power determination result P(k,n). For example, the power determination result P(k,n) is obtained with the following formula.

$$P(k,n) = \begin{cases} 1 & \text{if } \overline{X}(k,n) > Thr1 \\ -1 & \text{otherwise} \end{cases} \qquad \text{[Formula 1]}$$

Thus, the above example indicates that the power condition is satisfied if the power determination result P(k,n) is 1.

<Delay Part 143>

The delay part 143 receives the maximum value ⁻X(k,n) as an input, stores the value, and outputs the value at the request of the time constant determination part 142.

<Time Constant Determination Part 142>

The time constant determination part 142 receives the maximum value ⁻X(k,n) as an input and retrieves the maximum value ⁻X(k,n−1) for the immediately preceding time (frame) from the delay part 143. The time constant determination part 142 determines whether the difference value of the maximum value ⁻X(k,n) from the maximum value for the immediately preceding time (frame) satisfies a condition (S142), and outputs a time constant determination result S(k,n).

In this embodiment, whether the difference value of the maximum value ⁻X(k,n) from the maximum value for the immediately preceding time (frame) satisfies the condition is determined from the magnitude relationship between a value indicating a variation in the maximum value ⁻X(k,n) and a value indicating a predetermined variation. The value indicating the variation in the maximum value ⁻X(k,n) is the ratio ⁻X(k,n)/⁻X(k,n−1) between the maximum value ⁻X(k,n) for the current frame and the maximum value ⁻X(k,n−1) for the past frame. The value indicating the predetermined variation is a predetermined time constant β3. The time constant determination part 142 determines whether the maximum value ⁻X(k,n) for the current frame is greater than the value β⁻X(k,n−1) resulting from multiplying the maximum value ⁻X(k,n−1) for the preceding frame by the time constant β, and outputs a variation determination result S(k,n). For example, the variation determination result S(k,n) is obtained with the following formula.

$$S(k, n) = \begin{cases} 1 & \text{if } \overline{X}(k, n) > \beta \overline{X}(k, n-1) \\ -1 & \text{otherwise} \end{cases} \quad \text{[Formula 2]}$$

The time constant β is typically a value sufficiently greater than reverberations in the room and less than 1 (=no attenuation). Thus, the above example indicates that the variation condition is satisfied if the variation determination result S(k,n) is 1.

<Gain Calculation Part 144>

The gain calculation part 144 receives the power determination result P(k,n) and the variation determination result S(k,n) as inputs, calculates a gain for suppressing howling (S144), and outputs the gain. For example, if a power index ⁻P(k,n) obtained from the power determination result P(k,n) for the current frame is smaller than a predetermined value ⁻$P_{min}$, the gain calculation part 144 sets ⁻P(k,n)=⁻$P_{min}$. If the power index ⁻P(k,n) is greater than a predetermined value ⁻$P_{max}$, the gain calculation part 144 sets ⁻P(k,n)=⁻$P_{max}$. The gain calculation part 144 then obtains a first gain $G_p$ based on the magnitude relationship between the power index ⁻P(k,n) and a predetermined threshold $P_{thr}$. Here, ⁻$P_{min}$<⁻$P_{max}$. For example, the first gain $G_p$ is obtained as follows.

$$\overline{P}(k, n) = \overline{P}(k, n-1) + P(k, n) \quad \text{[Formula 3]}$$

$$\overline{P}(k, n) = \begin{cases} \overline{P}_{max}(k, n) & \text{if } \overline{P}(k, n) > \overline{P}_{max}(k, n) \\ \overline{P}_{min}(k, n) & \text{if } \overline{P}(k, n) < \overline{P}_{min}(k, n) \\ \overline{P}(k, n) & \text{otherwise} \end{cases}$$

$$G_P(k, n) = \begin{cases} G_{p1}(k, n) & \text{if } \overline{P}(k, n) > P_{thr} \\ 1 & \text{otherwise} \end{cases}$$

$G_{p1}$ is a fixed value greater than or equal to 0 and less than or equal to 1. The initial value of ⁻P(k,n) for n=0 is 0.

Further, if a time constant index ⁻S(k,n) obtained from the variation determination result S(k,n) for the current frame is smaller than a predetermined value ⁻$S_{min}$, the gain calculation part 144 sets ⁻S(k,n)=⁻$S_{min}$. If the time constant index ⁻S(k,n) is greater than a predetermined value ⁻$S_{max}$, the gain calculation part 144 sets ⁻S(k,n)=⁻$S_{max}$. The gain calculation part 144 then obtains a second gain $G_S$ based on the magnitude relationship between the time constant index ⁻S(k,n) and a predetermined threshold $S_{thr}$. Here, ⁻$S_{min}$<⁻$S_{max}$. For example, the second gain $G_S$ is obtained as follows.

$$\overline{S}(k, n) = \overline{S}(k, n-1) + S(k, n) \quad \text{[Formula 4]}$$

$$\overline{S}(k, n) = \begin{cases} \overline{S}_{max}(k, n) & \text{if } \overline{S}(k, n) > \overline{S}_{max}(k, n) \\ \overline{S}_{min}(k, n) & \text{if } \overline{S}(k, n) < \overline{S}_{min}(k, n) \\ \overline{S}(k, n) & \text{otherwise} \end{cases}$$

$$G_S(k, n) = \begin{cases} G_{s1}(k, n) & \text{if } \overline{S}(k, n) > S_{thr} \\ 1 & \text{otherwise} \end{cases}$$

$G_{S1}$ is a fixed value greater than or equal to 0 and less than or equal to 1. The initial value of ⁻S(k,n) for n=0 is 0.

The gain calculation part 144 sets the smaller one of the first gain $G_P$ and the second gain $G_S$ as a third gain G and outputs the third gain G as a gain for suppressing howling. For example, the third gain G is obtained as follows:

$$G(k,n)=\min\{G_P,G_S\}$$

where min { } means outputting the minimum value in { }.

<Gain Superposition Part 145>

The gain superposition part 145 receives the third gain G and the signal $X_i$(k,n) as inputs, multiplies the signal $X_i$(k,n) by the third gain G (S145), and outputs the product as a suppressed signal $Y_i$(k,n).

$$Y_i(k,n)=X_i(k,n)G(k,n)$$

<Frequency Reverse-Conversion Part 150>

The frequency reverse-conversion part 150 receives the signal $Y_i$(k,n) as an input, converts the signal into a time-domain signal (S150), and outputs the converted signal $y_i$(t) as an output value of the howling suppression apparatus 100-$i$. Converting into the time domain may use a method corresponding to the method used for converting into the frequency domain used in the frequency conversion part 110. For example, the frequency-domain signal $Y_i$(k,n) is converted into the time-domain signal with inverse Fourier transform (such as inverse fast Fourier transform):

$$y_i(n)=IFT(Y_i(k,n))$$

where $y_i$(n)=[$y_i$(nT−T+1), $y_i$(nT−T+2), . . . , $y_i$(nT)]. The time-domain signal $y_i$(n) obtained for each frame with inverse Fourier transform is appropriately shifted to calculate a linear combination, resulting in the continuous time-domain signal $y_i$(t).

Advantageous Effects

With the above configuration, a delay in howling detection can be prevented to improve the howling prevention effect of the loudspeaker system.

By disposing the two howling suppression apparatuses 100-$i$ as in FIG. 3 and performing the howling suppression processing in each of the apparatuses for i=1, 2, the occurrence of howling from the two channels can be suppressed.

First Modification

Although the first gain $G_{p1}$ and the second gain $G_{s1}$ are fixed values in this embodiment, they may be varied with the input sound signal. For example, the following formula is set.

$$G_{p1} = \alpha \times Thr2 / ^-X(k,n)$$

$\alpha$ is a real number greater than or equal to 0 and less than or equal to 1. If $X_i(k,n) = ^-X(k,n)$ and if $\alpha=1$, $G_{p1}$ is a suppression gain that reduces $X_i(k,n)$ to Thr2. If $\alpha$ is less than 1, an amount of suppression is set that reduces $X_i(k,n)$ to be further smaller than Thr2. For example, Thr2 is set to a value such that any sound greater than or equal to that value is regarded as howling, or to a value less than that value. Thr2 may also be set to a value less than or equal to Thr1 used in the power determination part 141.

Similarly, for the second gain $G_{s1}$, the following formula may be set.

$$G_{S1} = \alpha 2 \times Thr3 / ^-X(k,n)$$

$\alpha 2$ is a real number greater than or equal to 0 and less than or equal to 1. Thr3 is set in the same manner as Thr2.

Second Modification

Figure 9:
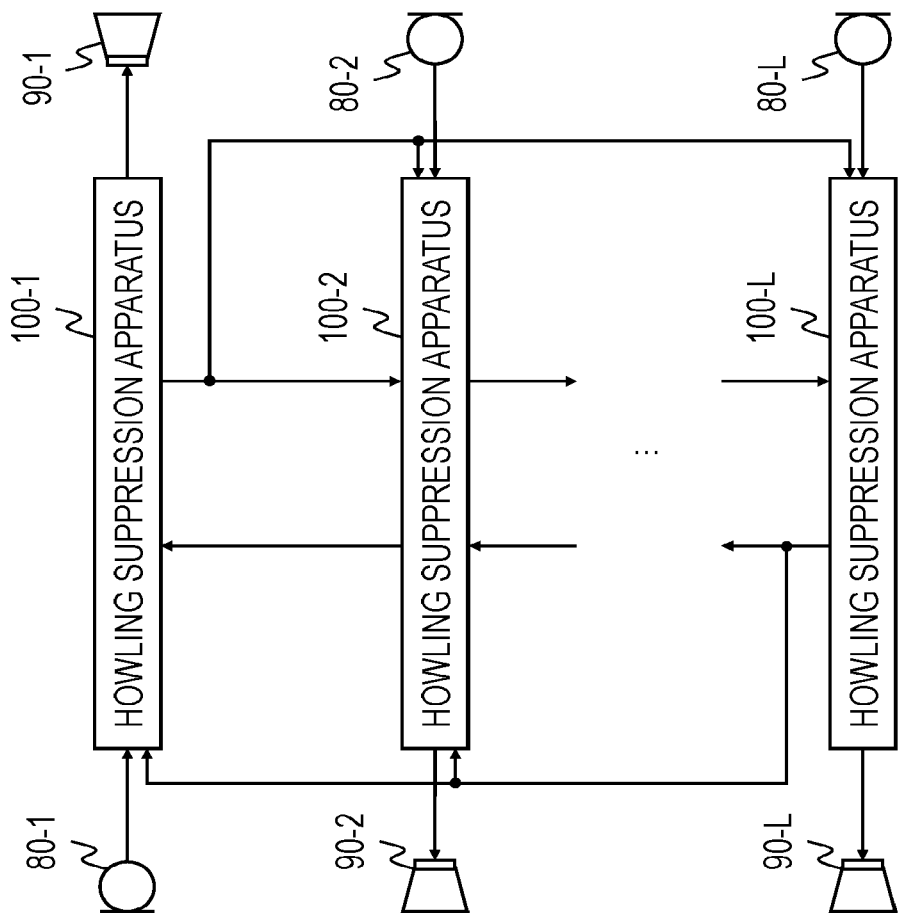
FIG. 9 is a diagram showing an exemplary arrangement of L howling suppression apparatuses in a second modification of the first embodiment.

The howling suppression system may include L howling suppression apparatuses 100-$i$ (see FIG. 9). L is any integer equal to or greater than 2, and i=1, 2, . . . , L.

In this second modification, the integration processing part 130 receives, as inputs, a value $X'_i(k,n)$, which is an output value of the smoothing processing part 120 of the howling suppression apparatus 100-$i$, and values $X'_j(k,n)$, which are output values of the smoothing processing parts 120 of the other L-1 howling suppression apparatuses 100-$j$, for j=1, 2, . . . , L, and i≠j. The integration processing part 130 obtains the maximum value $^-X(k,n)$ among the L values $X'_i(k,n)$ (S130) and outputs the maximum value. This processing of obtaining the maximum value may also be referred to as the processing of integrating the L values $X'_i(k,n)$, and the maximum value $^-X(k,n)$ may also be referred to as the integrated value. For example, the maximum value is obtained with the following formula:

$$^-X(k,n) = \max\{X'_1(k,n), X'_2(k,n), \ldots, X'_L(k,n)\}$$

where max{ } means outputting the maximum value in { }.

With this configuration, the howling suppression system in the first embodiment can be expanded into a system that includes L howling suppression apparatuses 100-$i$. The first embodiment could be said to be an example of the second modification.

In an exemplary configuration, L-1 output values $y_i$ from the output values $y_i$ of the L howling suppression apparatuses 100-$i$ may be combined (mixed) and output to the speaker 90-$i$. For example, the L output values $y_i$ minus an output value $y_i$ corresponding to the sound signal collected by the microphone of one microphone speaker (L-1 output values $y_i$) may be combined, and reproduced by the speaker of the same microphone speaker.

Third Modification

Figure 10:
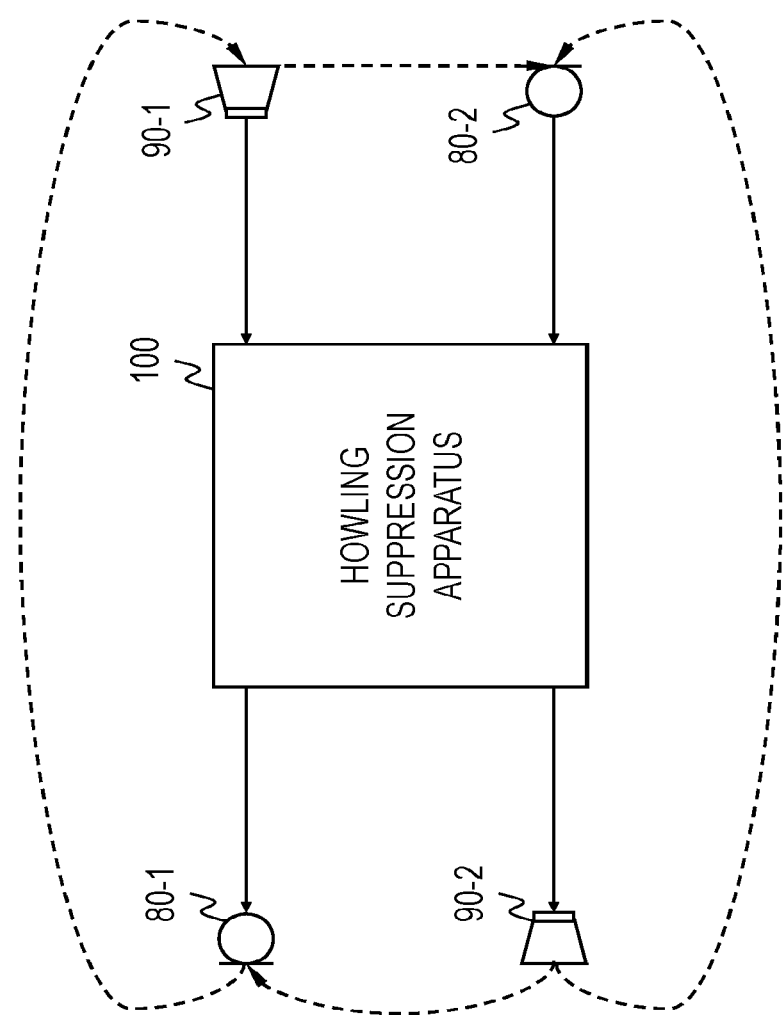
FIG. 10 is a diagram showing an exemplary arrangement of a howling suppression apparatus in a third modification of the first embodiment.
Figure 11:
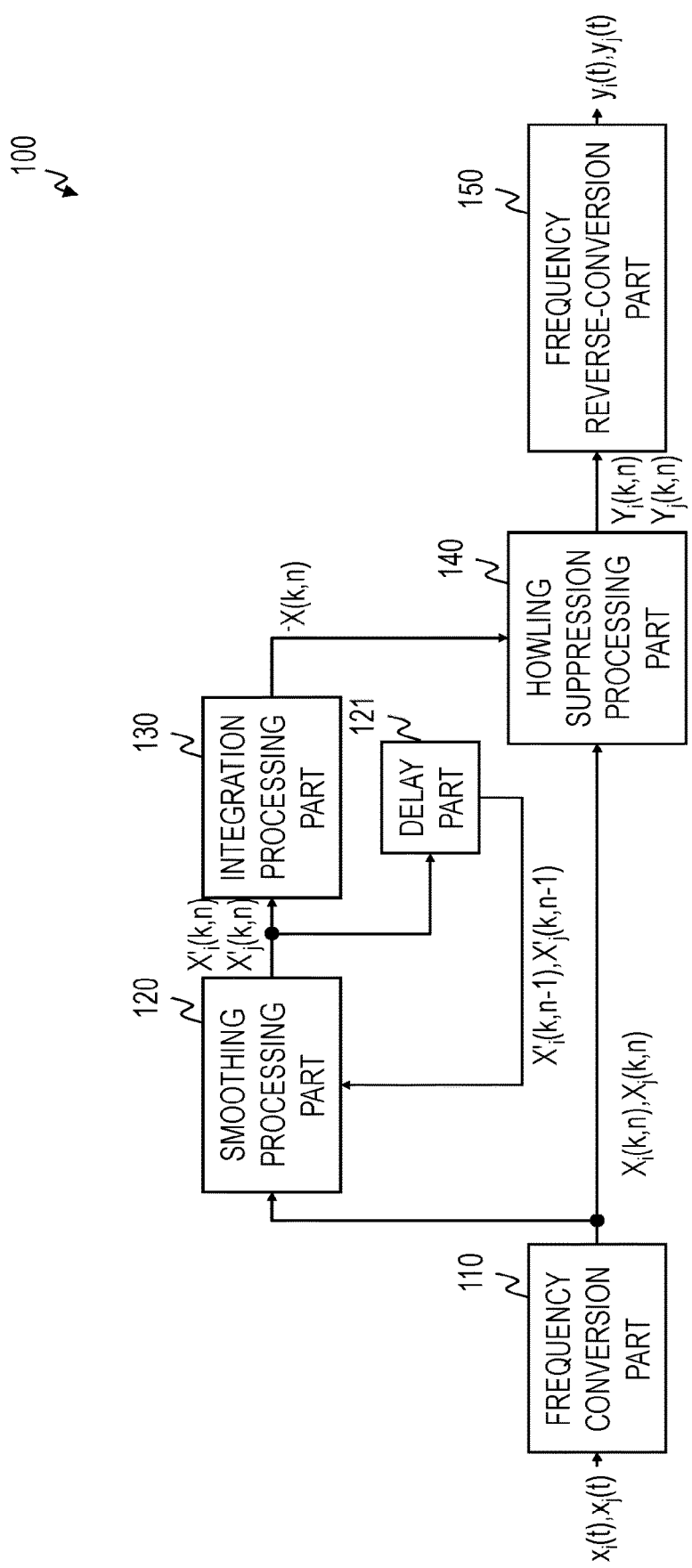
FIG. 11 is a functional block diagram of the howling suppression apparatus according to the third modification of the first embodiment.

The two howling processing apparatuses 100-$i$ in this embodiment may be embodied as one apparatus. FIG. 10 shows an exemplary arrangement of a howling suppression apparatus 100 in a third modification. FIG. 11 shows a functional block diagram of the howling suppression apparatus according to this modification. The howling suppression apparatus 100 includes a frequency conversion part 110, a smoothing processing part 120, a delay part 121, an integration processing part 130, a howling suppression processing part 140, and a frequency reverse-conversion part 150, each of which performs processing similar to the processing in the first embodiment. However, in contrast to the first embodiment in which a signal of one channel is processed in each part except the integration processing part, signals of two channels are processed in this modification. The integration processing part performs processing as in the first embodiment.

With this configuration, as shown in FIG. 10, the howling suppression apparatus 100 receives, as inputs, sound signals collected by the microphones 80-$i$ of the two channels, suppresses howling components in the respective sound signals collected by the two microphones 80-$i$, and outputs the respective suppressed signals to the two speakers 90-$i$.

The first to third modifications may be combined with each other.

Other Modifications

In this embodiment and its modifications, howling components are suppressed in all the L channels. Alternatively, howling components may be suppressed in at least one of the L channels. For example, in the first embodiment, only one of the howling suppression processing apparatuses 100-1 and 100-2 may be disposed. Then the frequency conversion part 110 and the smoothing processing part 120 in the disposed howling suppression processing apparatus process the sound signal collected by the microphone of the other channel (S110, S120), thereby generating the input value to the integration processing part 130.

Although the howling prevention effect according to this configuration is lower than that of the first embodiment, a delay in howling detection can still be prevented to improve the howling prevention effect of the loudspeaker system.

In this embodiment, the time-domain sound signal collected by the microphone is taken as an input. Alternatively, a sound signal converted into a frequency-domain signal by a separate apparatus may be taken as an input. In this case, the howling suppression apparatus 100-$i$ may not include the frequency domain conversion part 110.

The smoothing processing performed in the smoothing processing part 120 stabilizes the frames. However, even without the smoothing processing, a delay in howling detection can still be prevented to improve the howling prevention effect of the loudspeaker system. Therefore, the howling suppression apparatus 100-$i$ may not include the smoothing processing part 120.

The integration processing part 130 may receive, as inputs, L i-th signals that are frequency-domain signals obtained from sound signals collected by multiple microphones. For example, in addition to the two values $X'_i(k,n)$ and $X'_j(k,n)$ in this embodiment, the integration processing part 130 may receive, as inputs, the frequency-domain signal $X_i(k,n)$ before being subjected to the smoothing processing, and frequency-domain signals resulting from performing signal processing such as beamforming processing and noise suppression processing on sound signals collected by multiple microphones.

The howling suppression apparatus 100-$i$ may, for example, simply output the frequency-domain signal $Y_i(k,$ n). An apparatus in a subsequent stage may then perform some signal processing on the frequency-domain signal $Y_i(k,n)$ and convert the processed signal into a time-domain signal. Therefore, the howling suppression apparatus 100-$i$ may not include the frequency reverse-conversion part 150.

<Key Points of Second Embodiment>

In the integration processing part 130 in the first embodiment, the influence of beats can be reduced with $^-X(k,n)=\max\{X_i'(k,n), Xj'(k,n)\}$. However, this may be affected by other sounds, such as a voice uttered on one side. That is, $^-X(k,n)$ takes a large value if either side has large frequency components.

To address this, an approach is proposed that utilizes the fact that "a voice uttered on one side" has a high sound pressure only on that side, and sets the formula:

$$^-X(k,n)=\min\{X_i'(k,n), Xj'(k,n)\}$$

where min means outputting the minimum value in { }.

According to the above, if a voice is normally uttered (in other words, if a speaking person utters a voice while no howling is occurring), the smaller one of the values of the two channels is selected. By contrast, if some howling is occurring, the smaller one of the values of the two channels is relatively large in comparison with the case of a normally uttered voice because the sounds of the two channels increase at almost the same volume rate. Using such a value makes it easier to distinguish between howling sounds and other sounds than in the first embodiment.

The above approach conversely makes it difficult to identify a beat phenomenon, but this problem is mitigated by defining a variable as follows.

$$C(k,n) = \begin{cases} 1 & \text{if } X_i'(k,n) \geq X_j' \\ -1 & \text{otherwise} \end{cases} \quad \text{[Formula 5]}$$

If the sign of this variable frequently switches between positive and negative in a short period, beating is identified.

In a second embodiment, a configuration for implementing the above approach will be described.

Second Embodiment

What are different from the first embodiment will mainly be described.

Figure 12:
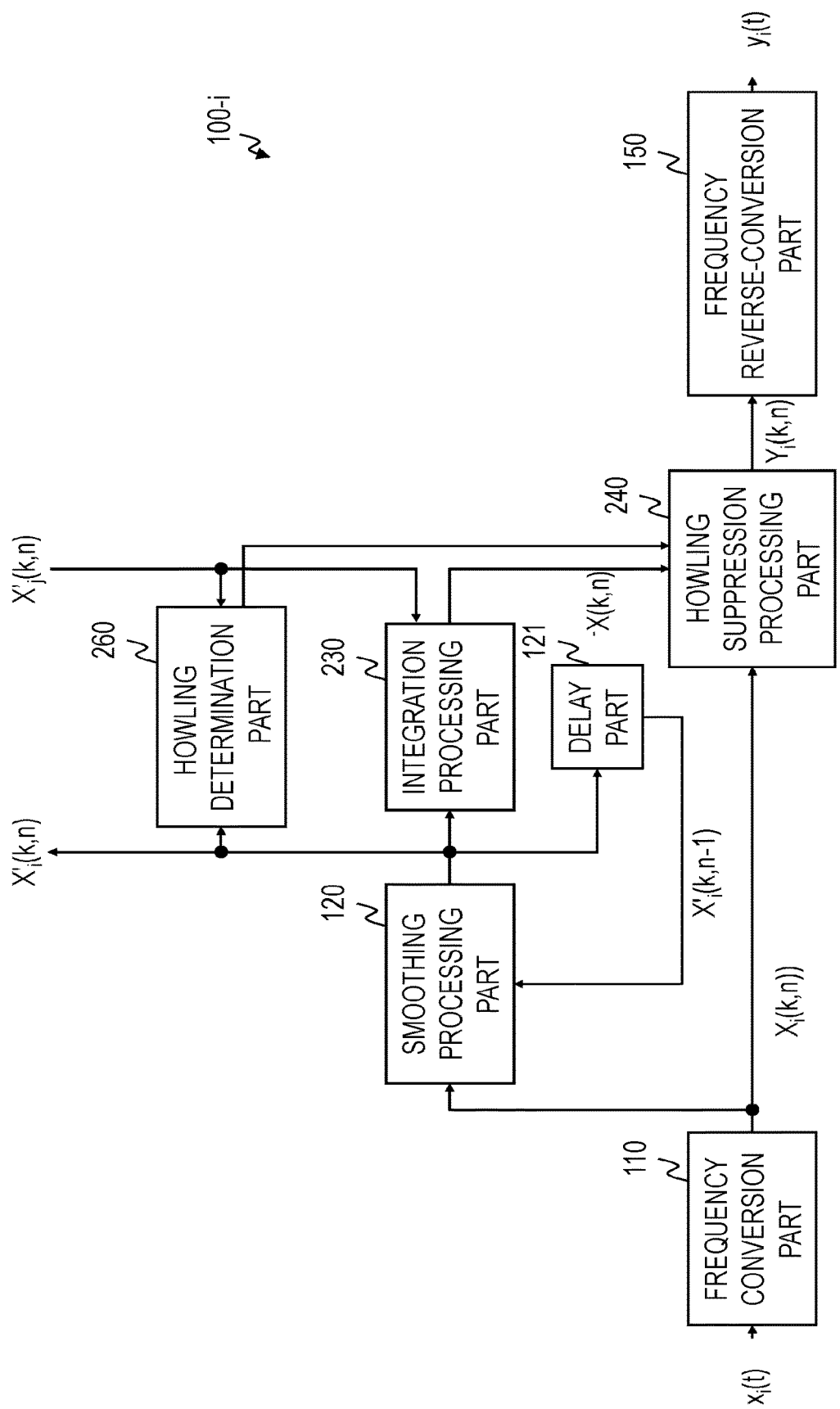
FIG. 12 is a functional block diagram of a howling suppression apparatus according to a second embodiment.
Figure 13:
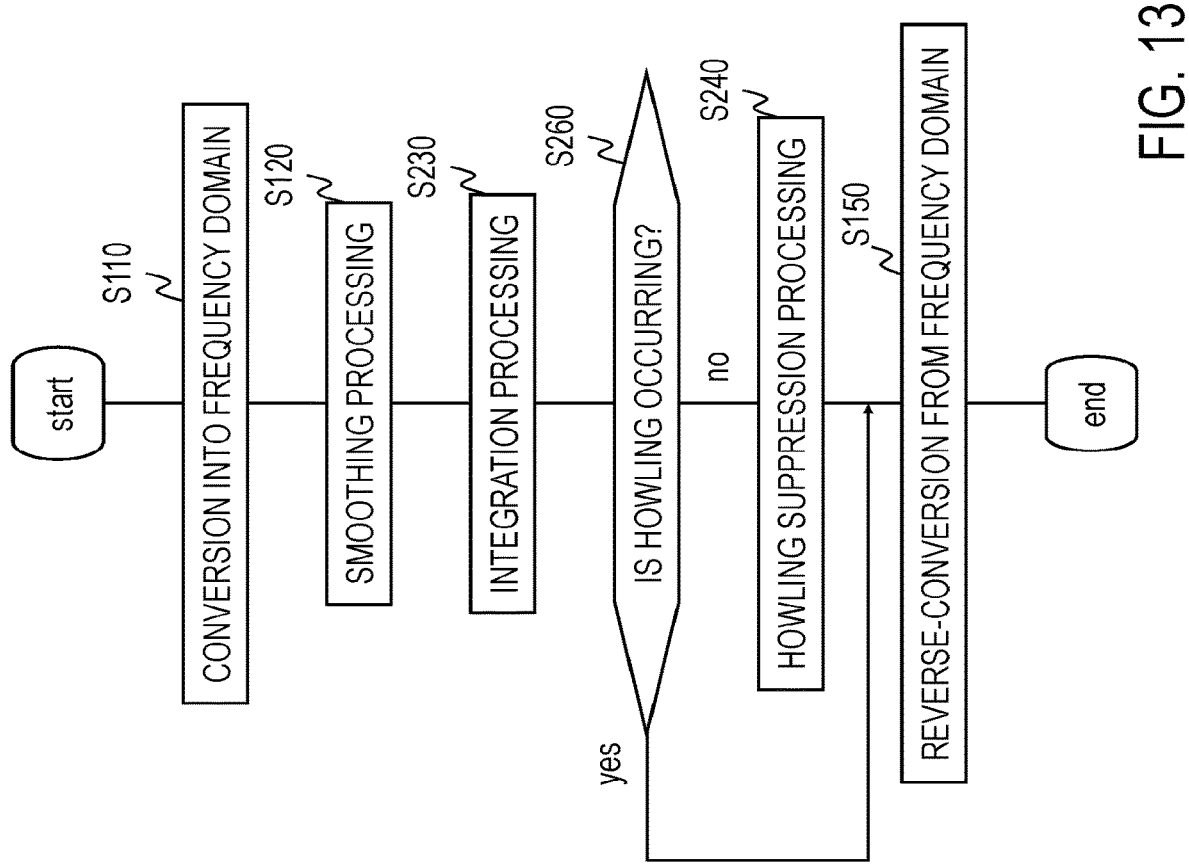
FIG. 13 is a diagram showing an exemplary process flow of the howling suppression apparatus according to the second embodiment.

FIG. 12 shows a functional block diagram of a howling suppression apparatus according to the second embodiment, and FIG. 13 shows a process flow thereof.

Each howling suppression apparatus 100-$i$ includes a frequency conversion part 110, a smoothing processing part 120, a delay part 121, an integration processing part 230, a howling determination part 260, a howling suppression processing part 240, and a frequency reverse-conversion part 150. Processing in the frequency conversion part 110, the smoothing processing part 120, and the frequency reverse-conversion part 150 are similar to the processing in the first embodiment.

In order to utilize the fact that "a voice uttered on one side" has a high sound pressure only on that side, two microphones 80-$i$ are disposed at different distances from the sound source.

<Integration Processing Part 230>

The integration processing part 230 receives, as inputs, a value $X'_i(k,n)$, which is an output value of the smoothing processing part 120 of the howling suppression apparatus 100-$i$, and a value $X'_j(k,n)$, which is an output value of the smoothing processing part 120 of the other howling suppression apparatus 100-$j$. The integration processing part 230 obtains the minimum value $^-X(k,n)$ between the two values $X'_i(k,n)$ and $X'_j(k,n)$ (S230) and outputs the minimum value. This processing of obtaining the minimum value may also be referred to as the processing of integrating the two values $X'_i(k,n)$ and $X'_j(k,n)$, and the minimum value $^-X(k,n)$ may also be referred to as the integrated value. For example, the minimum value is obtained with the following formula.

$$^-X(k,n)=\min\{X_i'(k,n), Xj'(k,n)\}$$

<Howling Determination Part 260>

The howling determination part 260 receives, as inputs, the value $X'_i(k,n)$, which is the output value of the smoothing processing part 120 of the howling suppression apparatus 100-$i$, and the value $X'_j(k,n)$, which is the output value of the smoothing processing part 120 of the other howling suppression apparatus 100-$j$. If the sign of the difference between the two values $X'_i(k,n)$ and $X'_j(k,n)$ changes a predetermined number of times or more in a predetermined period, the howling determination part 260 determines that howling is likely to occur or is occurring (S260) and outputs the determination result. For example, if it is determined that howling is likely to occur or is occurring, 1 is output as the determination result; otherwise, 0 is output.

Whether the sign of the difference between the two values $X'_i(k,n)$ and $X'_j(k,n)$ changes may be determined using the sign of $(X'_i(k,n)-X'_j(k,n))$, or may be determined using the sign of the variable defined as described above:

$$C(k,n) = \begin{cases} 1 & \text{if } X_i'(k,n) \geq X_j' \\ -1 & \text{otherwise} \end{cases} \quad \text{[Formula 6]}$$

For example, in the example of FIG. 8, the sign changes six times in 0.1 seconds. The predetermined period and the predetermined number of times may be set so that such a state can be detected.

<Howling Suppression Processing Part 240>

The howling suppression processing part 240 receives, as inputs, the minimum value $^-X(k,n)$, the frequency-domain signal $X_i(k,n)$, and the determination result of the howling determination part 260. If the determination result indicates that howling is likely to occur or is occurring, the howling suppression processing part 240 performs howling suppression processing on the signal $X_i(k,n)$ using the minimum value $^-X(k,n)$ (S240) and outputs a suppressed signal $Y_i(k,n)$. If the above-described condition is not satisfied (if the determination result does not indicate that howling is likely to occur or is occurring), the howling suppression processing part 240 does not perform howling suppression processing on the signal $X_i(k,n)$ and outputs the signal $Y_i(k,n)=X_i(k,n)$. If the howling suppression processing is to be performed, processing similar to the processing in the howling suppression processing part 140 may be performed using the minimum value $^-X(k,n)$ instead of the maximum value $^-X(k,n)$. Note that values such as the threshold Thr1 and the time constant β need to be appropriately set for the minimum value $^-X(k,n)$. In this embodiment, the howling suppression processing is continuously performed once it is performed. Accordingly, the howling determination part 260 may not perform the determination processing once it determines that howling is likely to occur or is occurring. If the determination result does not indicate that howling is likely to occur or is occurring, the howling suppression processing may not be repeated and the howling determination part 260 may resume the determination processing.

Advantageous Effects

With the above configuration, advantageous effects as in the first embodiment can be achieved. Further, howling can be appropriately suppressed even if sounds other than howling sounds are being produced. This embodiment may be combined with the modifications of the first embodiment. The determination result of the howling determination part 260 may also be input to the integration part 230, and if the determination result does not indicate that howling is likely to occur or is occurring, the integration processing in the integration processing part 230 (S230) may be omitted.

Other Modifications

The present invention is not limited to the above-described embodiments and modifications. For example, the above-described process steps may be performed sequentially as described, as well as in parallel or in separate processes according to the processing capability of the processing apparatus or according to the necessity. Other changes may be made as appropriate without departing from the spirit of the present invention.

<Program and Recording Medium>

The various processing functions in each of the apparatuses described in the above embodiments and modifications may be implemented by a computer. In this case, details of the processing of the functions to be provided in the apparatus are written as a program. The program is executed by the computer to cause the various processing functions in each of the above apparatuses to be implemented on the computer.

The program describing the details of the processing may be recorded on a computer-readable recording medium. The computer-readable recording medium may be any appropriate medium, for example a magnetic recording device, an optical disc, a magneto-optical recording medium, or semiconductor memory.

The program may be distributed by, for example, selling, giving, or lending a portable recording medium, such as a DVD or a CD-ROM, having the program recorded thereon. The program may further be distributed by storing the program in a storage device in a server computer and transferring the program from the server computer to another computer over a network.

First, the computer executing the program once stores, in its storage, the program recorded on a portable recording medium or transferred from a server computer. When performing processing, the computer reads the program stored in its storage and performs processing according to the program read. As another embodiment of the program, the computer may directly read the program from the portable recording medium and perform processing according to the program. Further, as portions of the program are sequentially transferred from the server computer to the computer, the computer may sequentially perform processing according to the received portions of the program. The above processing may also be performed through what is called an ASP (Application Service Provider) service, in which case the server computer does not transfer the program to the computer but the processing functions are implemented only by instructing to execute the program and obtaining the results. The program here includes information that is not the program itself but is used for processing in a computer (such as data that does not contain direct instructions to the computer but has a nature of defining processing in the computer).

Although the apparatuses have been described as configured by executing a predetermined program on a computer, at least part of the processing in the apparatuses may be implemented in hardware.

What is claimed is:

1. A howling suppression apparatus comprising:
processing circuitry configured to
obtain a maximum value among L values corresponding to n-th frames of L i-th signals, for i=1, 2, . . . , L, L being any integer equal to or greater than 2, n being a frame number at a current time, the L i-th signals being frequency-domain signals obtained from sound signals collected by a plurality of microphones; and
perform howling suppression processing on at least any of the L i-th signals using the maximum value, wherein
the processing circuitry performs the howling suppression processing by utilizing a fact that howling components are out of phase among the sound signals collected by the plurality of microphones.

2. A howling suppression apparatus comprising:
processing circuitry configured to
obtain a maximum value among L values corresponding to n-th frames of L i-th signals, for i=1, 2, . . . , L, L being any integer equal to or greater than 2, n being a frame number at a current time, the L i-th signals being frequency-domain signals obtained from sound signals collected by a plurality of microphones; and
perform howling suppression processing on at least any of the L i-th signals using the maximum value, wherein, at least either (i) if the maximum value is greater than a value indicating predetermined power or (ii) if a value indicating a variation in the maximum value is greater than a value indicating a predetermined variation, the processing circuitry performs the howling suppression processing by multiplying at least any of the L i-th signals by a smaller one of a first gain obtained based on the maximum value and a second gain obtained based on the value indicating the variation in the maximum value.

3. A howling suppression apparatus comprising:
processing circuitry configured to
obtain a maximum value among L values corresponding to n-th frames of L i-th signals, for i=1, 2, . . . , L, L being any integer equal to or greater than 2, n being a frame number at a current time, the L i-th signals being frequency-domain signals obtained from sound signals collected by a plurality of microphones,
perform howling suppression processing on at least any of the L i-th signals using the maximum value; and
obtain the L values by smoothing the L i-th signals in a temporal direction, wherein
the processing circuitry is further configured to:
obtain a power determination result $P(k,n)$ indicating whether the maximum value is greater than a value indicating predetermined power;
obtain a variation determination result $S(k,n)$ indicating whether the maximum value for a current frame is greater than the maximum value for a past frame multiplied by a predetermined time constant, a value indicating a variation in the maximum value being a ratio between the maximum value for the current frame and the maximum value for the past frame, a value indicating a predetermined variation being the predetermined time constant;

determine a first gain based on a magnitude relationship between a power index $^{-}P(k,n)$ and a predetermined threshold $P_{thr}$ by setting $^{-}P(k,n)=^{-}P_{min}$ if the power index $^{-}P(k,n)$ obtained from the power determination result $P(k,n)$ for the current frame is smaller than a predetermined value $^{-}P_{min}$ and by setting $^{-}P(k,n)=^{-}P_{max}$ if the power index $^{-}P(k,n)$ is greater than a predetermined value $^{-}P_{max}$, and determines a second gain based on a magnitude relationship between a time constant index $^{-}S(k,n)$ and a predetermined threshold $S_{thr}$ by setting $^{-}S(k,n)=^{-}S_{max}$ if the time constant index $^{-}S(k,n)$ obtained from the variation determination result $S(k,n)$ for the current frame is smaller than a predetermined value $^{-}S_{min}$ and by setting $^{-}S(k,n)=^{-}S_{max}$ if the time constant index $^{-}S(k,n)$ is greater than a predetermined value $^{-}S_{max}$; and multiply the L i-th signals by a smaller one of the first gain and the second gain.

4. A howling suppression apparatus comprising:

processing circuitry configured to obtain a minimum value among L values corresponding to n-th frames of L i-th signals, for i=1, 2, . . . , L, L being any integer equal to or greater than 2, n being a frame number at a current time, the L i-th signals being frequency-domain signals obtained from sound signals collected by a plurality of microphones;

determine that howling is likely to occur or is occurring if a sign of a difference between two values corresponding to n-th frames of two of the i-th signals changes a predetermined number of times or more in a predetermined period, the two of the i-th signals being sound signals collected by two of L microphones and converted into frequency-domain signals; and perform howling suppression processing on at least any of the L i-th signals using the minimum value if it is determined that howling is likely to occur or is occurring.

5. The howling suppression apparatus according to any of claims 1 and 4, wherein L=2.

6. A non-transitory recording medium having recorded thereon a program for causing a computer to function as the howling suppression apparatus according to any of claims 1 and 4.

7. The howling suppression apparatus according to claim 2 or 3, wherein the processing circuitry performs the howling suppression processing by utilizing a fact that howling components are out of phase among the sound signals collected by the plurality of microphones.

8. A method for suppressing howling, comprising:

an integration processing step of obtaining a maximum value among L values corresponding to n-th frames of L i-th signals, for i=1, 2, . . . , L, L being any integer equal to or greater than 2, n being a frame number at a current time, the L i-th signals being frequency-domain signals obtained from sound signals collected by a plurality of microphones; and a howling suppression processing step of performing howling suppression processing on at least any of the L i-th signals using the maximum value, wherein the howling suppression processing step performs the howling suppression processing by utilizing a fact that howling components are out of phase among the sound signals collected by the plurality of microphones.

9. A method for suppressing howling, comprising:

an integration processing step of obtaining a minimum value among L values corresponding to n-th frames of L i-th signals, for i=1, 2, . . . , L, L being any integer equal to or greater than 2, n being a frame number at a current time, the L i-th signals being frequency-domain signals obtained from sound signals collected by a plurality of microphones;

a howling determination step of determining that howling is likely to occur or is occurring if a sign of a difference between two values corresponding to n-th frames of two of the i-th signals changes a predetermined number of times or more in a predetermined period, the two of the i-th signals being sound signals collected by two of L microphones and converted into frequency-domain signals; and a howling suppression processing step of performing howling suppression processing on at least any of the L i-th signals using the minimum value if it is determined that howling is likely to occur or is occurring.

* * * * *